US009550269B2

(12) United States Patent
Shiokawa et al.

(10) Patent No.: US 9,550,269 B2
(45) Date of Patent: Jan. 24, 2017

(54) POLISHING DEVICE AND POLISHING METHOD

(71) Applicant: EBARA CORPORATION, Tokyo (JP)

(72) Inventors: Yoichi Shiokawa, Tokyo (JP); Keita Yagi, Tokyo (JP); Yoichi Kobayashi, Tokyo (JP)

(73) Assignee: Ebara Corporation, Tokyo (JP)

( * ) Notice: Subject to any disclaimer, the term of this patent is extended or adjusted under 35 U.S.C. 154(b) by 20 days.

(21) Appl. No.: 14/664,691

(22) Filed: Mar. 20, 2015

(65) Prior Publication Data
US 2015/0266159 A1 Sep. 24, 2015

(30) Foreign Application Priority Data

Mar. 20, 2014 (JP) .................................. 2014-057859
Nov. 10, 2014 (JP) .................................. 2014-228346

(51) Int. Cl.
| | | |
|---|---|---|
| B24B 49/04 | (2006.01) | |
| B24B 37/005 | (2012.01) | |
| H01L 21/66 | (2006.01) | |
| B24B 37/04 | (2012.01) | |
| H01L 21/321 | (2006.01) | |

(52) U.S. Cl.
CPC ............ B24B 37/005 (2013.01); B24B 37/042 (2013.01); B24B 49/04 (2013.01); H01L 22/12 (2013.01); H01L 22/26 (2013.01); *H01L 21/3212* (2013.01)

(58) Field of Classification Search
CPC ...... B24B 37/005; B24B 37/042; B24B 49/04; H01L 22/12; H01L 22/16; H01L 21/3212

USPC .............................. 451/5, 6, 11, 41, 285–290
See application file for complete search history.

(56) References Cited

U.S. PATENT DOCUMENTS

| | | | | |
|---|---|---|---|---|
| 5,584,751 A | * | 12/1996 | Kobayashi .............. | B24B 37/32 451/287 |
| 5,605,488 A | * | 2/1997 | Ohashi .................... | B24B 37/30 451/259 |
| 5,664,987 A | * | 9/1997 | Renteln ................. | B24B 37/005 451/21 |
| 5,795,215 A | * | 8/1998 | Guthrie .................... | B24B 5/00 451/285 |
| 5,964,653 A | * | 10/1999 | Perlov .................... | B24B 37/30 451/285 |

(Continued)

FOREIGN PATENT DOCUMENTS

| | | |
|---|---|---|
| JP | 2006-128582 A1 | 5/2006 |
| JP | 4689367 B2 | 2/2011 |

(Continued)

*Primary Examiner* — George Nguyen
(74) *Attorney, Agent, or Firm* — Baker & Hostetler LLP (57) ABSTRACT

The polishing device includes an edge chamber that presses the surface to be polished against the polishing pad by pressing a back side of the surface to be polished of the wafer, a thickness measuring unit that estimates a remaining film profile of the surface to be polished of the wafer in realtime during polishing, and a closed loop control device that controls a pressing force on the back side of the surface to be polished by the edge chamber in accordance with a measurement result by the thickness measuring unit during polishing. The closed loop control device controls not only the pressing by the edge chamber during polishing, but also the pressure of a retainer ring as a periphery of the edge chamber affecting the pressing of the surface to be polished against the polishing pad.

18 Claims, 9 Drawing Sheets

(56) References Cited

U.S. PATENT DOCUMENTS

| | | | |
|---|---|---|---|
| 6,077,151 A * | 6/2000 | Black | B24B 37/015 451/287 |
| 6,435,949 B1 * | 8/2002 | Katsuoka | B24B 37/30 451/288 |
| 6,776,692 B1 | 8/2004 | Zuniga et al. | |
| RE38,854 E * | 10/2005 | Nakashiba | B24B 37/042 451/285 |
| 7,066,785 B2 * | 6/2006 | Park | B24B 1/005 451/285 |
| 7,115,017 B1 * | 10/2006 | Laursen | B24B 37/30 451/287 |
| 7,150,673 B2 | 12/2006 | Sakurai et al. | |
| 7,160,739 B2 | 1/2007 | Shanmugasundram et al. | |
| 7,175,505 B1 * | 2/2007 | Ko | B24B 27/0023 451/5 |
| 7,822,500 B2 | 10/2010 | Kobayashi et al. | |
| 8,083,571 B2 | 12/2011 | Nabeya et al. | |
| 2007/0233306 A1 * | 10/2007 | Takada | B24B 37/013 451/66 |
| 2007/0239309 A1 * | 10/2007 | Tada | B24B 37/005 700/121 |
| 2007/0243796 A1 * | 10/2007 | Torii | B24B 37/32 451/5 |
| 2008/0139087 A1 * | 6/2008 | Togawa | B24B 37/013 451/8 |
| 2008/0268751 A1 * | 10/2008 | Yokoyama | B24B 37/005 451/5 |
| 2009/0036024 A1 * | 2/2009 | Matsuzaki | B24B 37/013 451/5 |
| 2010/0015889 A1 * | 1/2010 | Shimizu | B24B 37/013 451/5 |
| 2012/0058709 A1 * | 3/2012 | Fukushima | B24B 37/015 451/5 |
| 2012/0164917 A1 * | 6/2012 | Kobata | B24B 37/005 451/6 |
| 2013/0344773 A1 * | 12/2013 | Hiroo | B24B 37/013 451/5 |
| 2014/0127973 A1 * | 5/2014 | Motoshima | B24B 9/065 451/11 |
| 2015/0266159 A1 * | 9/2015 | Shiokawa | B24B 37/005 451/5 |

FOREIGN PATENT DOCUMENTS

| | | |
|---|---|---|
| JP | 2001-060572 A1 | 3/2011 |
| JP | 2014-017418 A | 1/2014 |

* cited by examiner

POLISHING DEVICE AND POLISHING METHOD

CROSS-REFERENCE TO RELATED APPLICATIONS

This application claims the benefit of Japanese Priority Patent Applications JP 2014-057859 filed on Mar. 20, 2014 and JP 2014-228346 filed on Nov. 10, 2014, the entire contents of which are incorporated herein by reference.

FIELD

The present technology relates to a polishing device and a polishing method, and in particular, relates to a polishing device and a polishing method that obtain a desired thickness profile by polishing an object to be polished such as a semiconductor wafer.

BACKGROUND AND SUMMARY

In recent years, with increasingly higher integration and densities of semiconductor devices, wires of circuits become increasingly finer and also the number of layers of multilayer interconnection is on the rise. To realize a multilayer interconnection while attempting to make wires of circuits finer, a step becomes ever larger by following surface unevenness of a lower layer and thus, with an increasing number of layers of interconnection, step coverage in thin film formation deteriorates. Therefore, to realize a multilayer interconnection, it is necessary to improve the step coverage and to carry out planarization in a proper process. In addition, the depth of focus becomes shallower with increasing fineness of optical lithography and it is necessary to planarize the surface of semiconductor devices such that an uneven step on the surface of semiconductor devices remains within the depth of focus. With increasing fineness of circuits, requirements for precision in planarization become higher. Also, with an ever more complex structure of a transistor periphery, precision requirements of planarization become higher not only in a multilayer interconnection process, but also in FEOL (Front End Of Line).

In a semiconductor device manufacturing process, therefore, planarization technologies of the surface of a semiconductor device become increasingly important. Among the planarization technologies, the most important technology is CMP (Chemical Mechanical Polishing). The chemical mechanical polishing polishes a substrate such as a semiconductor wafer by using a polishing device and bringing the substrate into sliding contact with a polishing surface while supplying a polishing liquid containing abrasive grains such as silica ($SiO_2$) onto the polishing surface such as a polishing pad.

This kind of polishing device includes a polishing table having the polishing surface made of the polishing pad and a substrate holding device called top ring, a polishing head or the like to hold a semiconductor wafer. When a semiconductor wafer is polished by using such a polishing device, the semiconductor wafer is pressed against the polishing surface with a predetermined pressure while the semiconductor wafer being held by the substrate holding device. By relatively moving the polishing table and the substrate holding device, the semiconductor wafer is brought into sliding contact with the polishing surface and the surface of the semiconductor wafer is polished flatly like a mirror finished surface.

If, in such a polishing device, a relative pressing force between the semiconductor wafer being polished and the polishing surface of the polishing pad is not uniform over the entire surface of the semiconductor wafer, insufficient polishing or excessive polishing may occur in accordance with the pressing force given to each portion of the semiconductor wafer. To make the pressing force on the semiconductor wafer uniform, a pressure chamber formed of a membrane is provided in a lower portion of the substrate holding device and a fluid such as a pressurized air is supplied into the pressure chamber so that polishing is performed while the semiconductor wafer being pressed against the polishing surface of the polishing pad by a fluid pressure via the membrane.

On the other hand, a thin film formed on the surface of a semiconductor wafer to be polished has a different thickness from position to position in the radial direction of the semiconductor wafer depending on the method of forming the thin film and device properties. That is, the surface of a semiconductor wafer has an initial thickness distribution in the radial direction. The above substrate holding device that uniformly presses and polishes the entire surface of the semiconductor wafer uniformly polishes the entire surface semiconductor wafer and thus cannot correct the initial thickness distribution of the surface of the semiconductor wafer.

Thus, a polishing device that controls the pressure of a fluid such as a pressurized air supplied to each of a plurality of pressure chambers formed from a membrane in a plane of a semiconductor wafer is proposed (for example, JP 2006-128582 A). This polishing device partially controls the pressure applied to the semiconductor wafer such that a pressing force on the polishing surface of a thick portion becomes larger than that of a thin portion to selectively increase the polishing rate of such a portion, thereby enabling flat polishing of proper thickness over the entire surface of the substrate without depending on the thickness distribution when the film is formed.

An object of the present technology is to provide a polishing device and a polishing method capable of polishing an object to be polished with precision.

According to an embodiment, provided is a polishing device that polishes a surface to be polished of an object to be polished by relatively sliding the surface to be polished and a polishing member including a pressing unit that presses the surface to be polished against the polishing member by pressing a back side of the surface to be polished of the object to be polished, a thickness measuring unit that estimates a remaining film profile of the surface to be polished of the object to be polished during polishing of the object to be polished, and a control unit that controls a pressing force on the back side of the surface to be polished by the pressing unit in accordance with a measurement result by the thickness measuring unit during the polishing of the object to be polished, wherein the control unit controls not only the pressing by the pressing unit during the polishing of the object to be polished, but also a periphery of the pressing unit affecting a pressing force of the surface to be polished on the polishing member during the polishing.

With this configuration, the pressing of the surface to be polished of a portion pressed directly by the pressing unit against the polishing member is controlled not only by the control of the pressing by the pressing unit, but also by the control of the pressing of the surface to be polished of the portion by the periphery against the polishing member and therefore, highly precise polishing can be performed. In addition, such control is exercised in accordance with polishing conditions during polishing of the object to be polished and even if a pressing force by the pressing unit is changed during the process of polishing, the periphery can be controlled accordingly.

In the polishing device, the periphery may be a retainer member that presses the polishing member near the pressing unit and the control unit may control not only the pressing force on the back side of the surface to be polished by the pressing unit, but also a pressing force on the polishing member by the retainer member.

With this configuration, by controlling the pressing of the retainer member against the polishing member, the pressing of the surface to be polished of the portion directly pressed by the pressing unit against the polishing member is controlled and therefore, highly precise polishing can be performed.

In the polishing device, the pressing unit may press an edge region on the back side of the surface to be polished of the object to be polished and the retainer member may be a member surrounding the object to be polished.

With this configuration, by controlling the pressing of the retainer member against the polishing member, the pressing of an edge region of the surface to be polished whose back side is directly pressed by the pressing unit against the polishing member is controlled and therefore, highly precise polishing can be performed in the edge region.

The polishing device may include a plurality of the pressing units that partially presses the back side of the surface to be polished of the object to be polished and the periphery may be the other neighboring pressing unit.

With this configuration, the pressing of the surface to be polished of the portion whose back side is directly pressed by some pressing unit against the polishing member is controlled by controlling the pressing of the back side of the surface to be polished by another neighboring pressing unit and therefore, highly precise polishing can be performed.

In the polishing device, the periphery may be a mechanism that controls the pressing force of the surface to be polished by deformation of an elastic body of the pressing unit.

With this configuration, the pressing force of the surface to be polished by deformation of the elastic body of the pressing unit can be controlled based on polishing conditions.

In the polishing device, the periphery may be a mechanism that controls deformation of an elastic body of the pressing unit.

With this configuration, the deformation of the elastic body of the pressing unit can be controlled based on polishing conditions.

In the polishing device, the control unit may control a pressing force of the periphery such that a thickness profile of the surface to be polished becomes uniform or a desired shape over an entire surface of the surface to be polished whose back side is directly pressed by the pressing unit.

With this configuration, even if the influence from the periphery on the pressing of the surface to be polished whose back side is directly pressed by the pressing unit against the polishing member is not uniform on the surface to be polished whose back side is directly pressed by the pressing unit, the surface to be polished whose back side is directly pressed by the pressing unit can uniformly be polished.

In the polishing device, control limiting values may be set to control of the periphery and the control unit may control the periphery within a range of the control limiting values.

With this configuration, when the control unit exercises control according to a predetermined algorithm, the periphery can be prevented from being controlled beyond control limits and therefore, accidents such as damage to the object to be polished or the polishing device can be prevented.

In the polishing device, the pressing unit may be formed from a circular pressure chamber and a plurality of annular pressure chambers therearound.

With this configuration, the thickness profile in the radial direction can be made a desired shape.

According to an embodiment, provided is a polishing method for polishing a surface to be polished of an object to be polished by relatively sliding the surface to be polished and a polishing member, including a pressing process of pressing the surface to be polished against the polishing member by pressing a back side of the surface to be polished of the object to be polished by a pressing unit, a thickness measuring process of estimating a remaining film profile of the surface to be polished of the object to be polished during polishing of the object to be polished, and a control process of controlling a pressing force on the back side of the surface to be polished by the pressing unit in accordance with a measurement result in the thickness measuring process during the polishing of the object to be polished, wherein the control process controls not only the pressing force on the back side of the surface to be polished by the pressing unit, but also a periphery of the pressing unit affecting a pressing force of the surface to be polished on the polishing member during the polishing.

Also with this configuration, the pressing of the surface to be polished of a portion pressed directly by the pressing unit against the polishing member is controlled not only by the control of the pressing by the pressing unit, but also by the control of the pressing of the surface to be polished of the portion by the periphery against the polishing member and therefore, highly precise polishing can be performed. In addition, such control is exercised in accordance with polishing conditions during polishing of the object to be polished and even if a pressing force by the pressing unit is changed during the process of polishing, the periphery can be controlled accordingly.

In the polishing method, a pressing force of the periphery maybe calculated during the polishing using a relationship of the pressing unit and the periphery with a polishing speed of the surface to be polished whose back side is directly pressed by the pressing unit.

With this configuration, the control of the pressing unit and the periphery in accordance with a measurement result in the thickness measuring process can be exercised.

In the polishing method, the pressing force on the back side of the surface to be polished and the pressing force of the periphery may be determined simultaneously by closed loop control.

With this configuration, more precise control can be realized.

DETAILED DESCRIPTION OF NON-LIMITING EXAMPLE EMBODIMENTS

Hereinafter, an embodiment of the present invention will be described with reference to the drawings. The embodiment described below shows an example when the present invention is carried out and does not intend to limit the present invention to the concrete configuration described below. When carrying out the present invention, a concrete configuration may appropriately be adopted in accordance with an embodiment.

Figure 1:
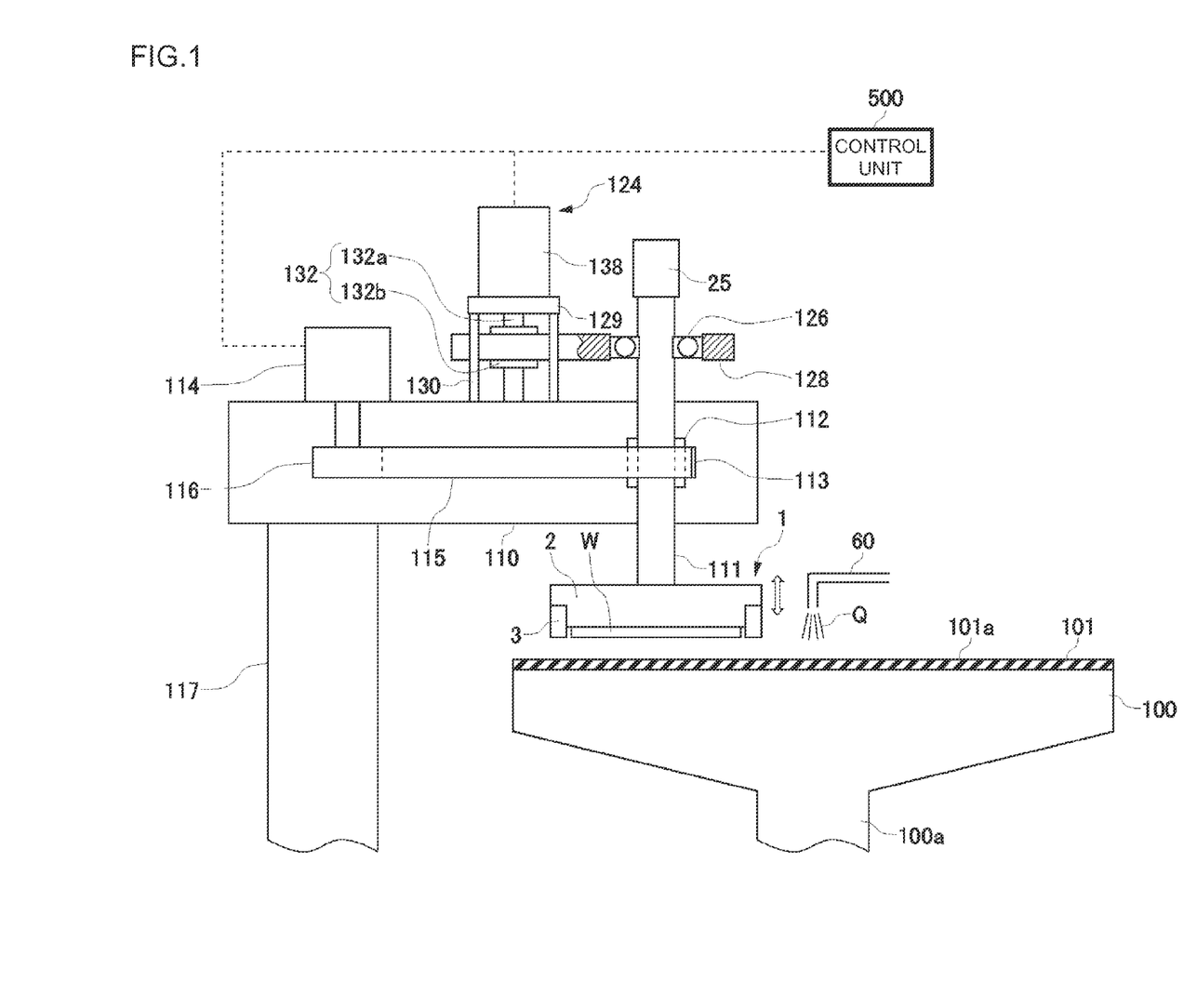
FIG. 1 is a schematic diagram showing an overall configuration of a polishing device according to an embodiment.

FIG. 1 is a schematic diagram showing an overall configuration of a polishing device according to an embodiment of the present invention. As shown in FIG. 1, the polishing device includes a polishing table 100 and a top ring 1 as a substrate holding device that holds a substrate such as a semiconductor wafer as an object to be polished and presses the substrate against the polishing surface on the polishing table 100. The polishing table 100 is connected to a motor (not shown) arranged below a table axis 100a via the table axis. The polishing table 100 rotates around the table axis 100a by the motor being rotated. A polishing pad 101 as a polishing member is stuck to the top surface of the polishing table 100. A surface 101a of the polishing pad 101 constitutes a polishing surface that polishes a semiconductor wafer W. A polishing liquid supply nozzle 60 is installed above the polishing table 100. A polishing liquid (polishing slurry) Q is supplied onto the polishing pad 101 on the polishing table 100 from the polishing liquid supply nozzle 60.

Various polishing pads are available on the market and, for example, SUBA800, IC-1000, IC-1000/SUBA400 (two-layer cloth) manufactured by Nitta Haas Incorporated and Surfin xxx-5 and Surfin 000 manufactured by Fujimi Incorporated are available. SUBA800, Surfin xxx-5, and Surfin 000 are nonwoven cloth obtained by hardening fibers by urethane resin and IC-1000 is hard foamed polyurethane (single layer). The foamed polyurethane is porous and has a large number of fine dents or holes on the surface thereof.

The top ring 1 is basically configured by a top ring body 2 that presses the semiconductor wafer W against the polishing surface 101a and a retainer ring 3 as a retainer member that prevents the semiconductor wafer W from flying out of the top ring 1 by holding an outer circumferential edge of the semiconductor wafer W. The top ring 1 is connected to a top ring shaft 111. The top ring shaft 111 is moved vertically by a vertical motion mechanism 124 with respect to a top ring head 110. The top ring 1 is positioned vertically by moving up and down the whole top ring 1 through vertical motion of the top ring shaft 111 with respect to the top ring head 110. A rotary joint 25 is mounted on the top end of the top ring shaft 111.

The vertical motion mechanism 124 that moves the top ring shaft 111 and the top ring 1 vertically includes a bridge 128 that rotatably supports the top ring shaft 111 via a bearing 126, a ball screw 132 mounted on the bridge 128, a support base 129 supported by a column 130, and an AC servo motor 138 provided on the support base 129. The support base 129 supporting the servo motor 138 is fixed to the top ring head 110 via the column 130.

The ball screw 132 includes a screw axis 132a connected to the servo motor 138 and a nut 132b into which the screw axis 132a screws. The top ring shaft 111 moves vertically together with the bridge 128. Therefore, if the servo motor 138 is driven, the bridge 128 is moved vertically via the ball screw 132 and thereby, the top ring shaft 111 and the top ring 1 are moved vertically.

The top ring shaft 111 is also connected to a rotating cylinder 112 via a key (not shown). The rotating cylinder 112 includes a timing pulley 113 in an outer circumferential portion thereof. A top ring rotating motor 114 is fixed to the top ring head 110 and the timing pulley 113 is connected to a timing pulley 116 provided in the top ring rotating motor 114 via a timing belt 115. Therefore, by driving the top ring rotating motor 114 to rotate, the rotating cylinder 112 and the top ring shaft 111 are integrally rotated via the timing pulley 116, the timing belt 115, and the timing pulley 113 and also the top ring 1 is rotated.

The top ring head 110 is supported by a top ring head shaft 117 rotatably supported by a frame (not shown). The polishing device includes a control unit 500 that controls each unit in the device including the top ring rotating motor 114, and servo motor 138, and a polishing table rotating motor.

Figure 2:
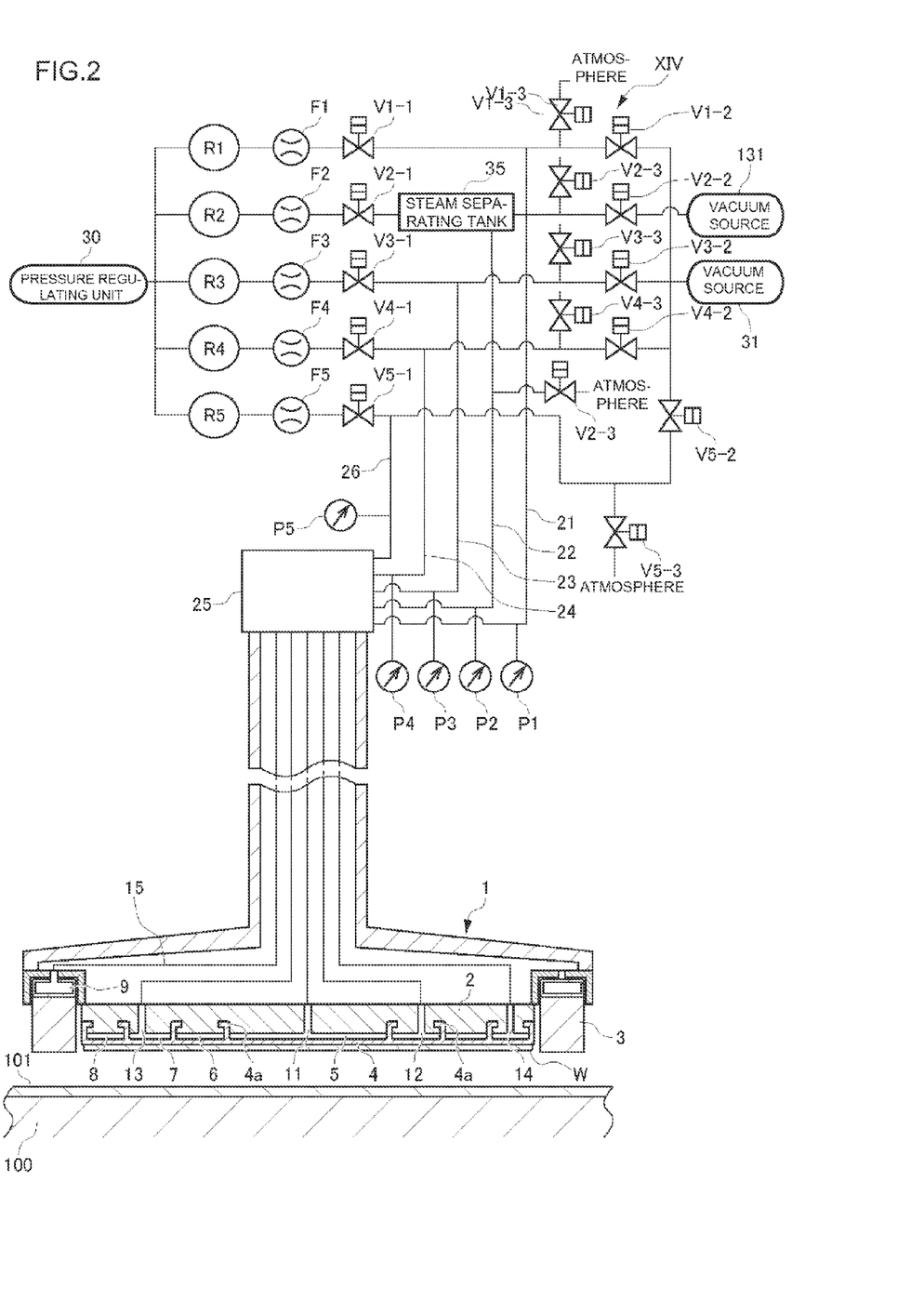
FIG. 2 is a schematic sectional view of a top ring according to an embodiment.

Next, the top ring (polishing head) 1 in the polishing device in the present invention will be described. FIG. 2 is a schematic sectional view of the top ring 1 as a substrate holding device that holds a semiconductor wafer as an object to be polished and presses the wafer against the polishing surface on the polishing table 100. In FIG. 2, only main components constituting the top ring 1 are shown.

As shown in FIG. 2, the top ring 1 is basically configured by the top ring body (also called a carrier) 2 that presses the semiconductor wafer W against the polishing surface 101a and the retainer ring 3 as a retainer member that directly presses the polishing surface 101a. The top ring body (carrier) 2 is made of a substantial disc member and the retainer ring 3 is mounted on the outer circumferential portion of the top ring body 2. The top ring body 2 is formed from a resin such as engineering plastics (for example, PEEK). A membrane 4 in contact with the back side of a semiconductor wafer is mounted on the undersurface of the top ring body 2. The membrane 4 is formed from a rubber member superior in strength and durability such as ethylene propylene rubber (EPDM), polyurethane rubber, and silicon rubber. The membrane 4 constitutes a substrate holding surface holding a substrate such as a semiconductor wafer.

The membrane 4 has a plurality of concentric partition walls 4a and a circular center chamber 5, an annular ripple chamber 6, an annular outer chamber 7, and an annular edge chamber 8 by these partition walls 4a between the top surface of the membrane 4 and the undersurface of the top ring body 2. That is, the center chamber 5 is formed in the center portion of the top ring body 2 and then, the ripple chamber 6, the outer chamber 7, and the edge chamber 8 are successively formed concentrically in the outer circumferential direction from the center. Inside the top ring body 2, a channel 11 communicatively connected to the center chamber 5, a channel 12 communicatively connected to the ripple chamber 6, a channel 13 communicatively connected to the outer chamber 7, and a channel 14 communicatively connected to the edge chamber 8 are formed.

The channel 11 communicatively connected to the center chamber 5, the channel 13 communicatively connected to the outer chamber 7, and the channel 14 communicatively connected to the edge chamber 8 are connected to channels 21, 23, 24 via the rotary joint 25. The channels 21, 23, 24 are connected to a pressure regulating unit 30 via valves V1-1, V3-1, V4-1 and pressure regulators R1, R3, R4 respectively. Also, the channels 21, 23, 24 are connected to a vacuum source 31 via valves V1-2, V3-2, V4-2 and can communicatively be connected to the atmosphere via valves V1-3, V3-3, V4-3 respectively.

On the other hand, the channel 12 communicatively connected to the ripple chamber 6 is connected to a channel 22 via the rotary joint 25. Then, the channel 22 is connected to the pressure regulating unit 30 via a steam separating tank 35, a valve V2-1, and a pressure regulator R2. Also, the channel 22 is connected to a vacuum source 131 via the steam separating tank 35 and a valve V2-2 and can communicatively be connected to the atmosphere via a valve V2-3.

Also, a retainer ring pressure chamber 9 is formed from a membrane 32 immediately above the retainer ring 3. The membrane 32 is housed inside a cylinder 33 fixed to a flange portion of the top ring 1. The retainer ring pressure chamber 9 is connected to a channel 26 via a channel 15 formed in the top ring body (carrier) 2 and the rotary joint 25. The channel 26 is connected to the pressure regulating unit 30 via a valve V5-1 and a pressure regulator R5. Also, the channel 26 is connected to the vacuum source 31 via a valve V5-2 and can communicatively be connected to the atmosphere via valve a V5-3.

The pressure regulators R1, R2, R3, R4, R5 have a pressure regulating function to regulate the pressure (pressing force) of a pressurized fluid supplied to the center chamber 5, the ripple chamber 6, the outer chamber 7, the edge chamber 8, and the retainer ring pressure chamber 9 from the pressure regulating unit 30 respectively. The pressure regulators R1, R2, R3, R4, R5 and the valves V1-1 to V1-3, V2-1 to V2-3, V3-1 to V3-3, V4-1 to V4-3, V5-1 to V5-3 are connected to the control unit 500 (see FIG. 1) so that the operation thereof is controlled. In addition, pressure sensors P1, P2, P3, P4, P5 and flow rate sensors F1, F2, F3, F4, F5 are installed in the channels 21, 22, 23, 24, 26 respectively.

The pressure of fluid supplied to the center chamber 5, the ripple chamber 6, the outer chamber 7, the edge chamber 8, and the retainer ring pressure chamber 9 is independently regulated by the pressure regulating unit 30 and the pressure regulators R1, R2, R3, R4, R5 respectively. By adopting the above structure, a pressing force pressing the semiconductor wafer W against the polishing pad 101 can be adjusted from region to region of the semiconductor wafer and also a pressing force of the retainer ring 3 to press the polishing pad 101 can be adjusted.

Figure 3:
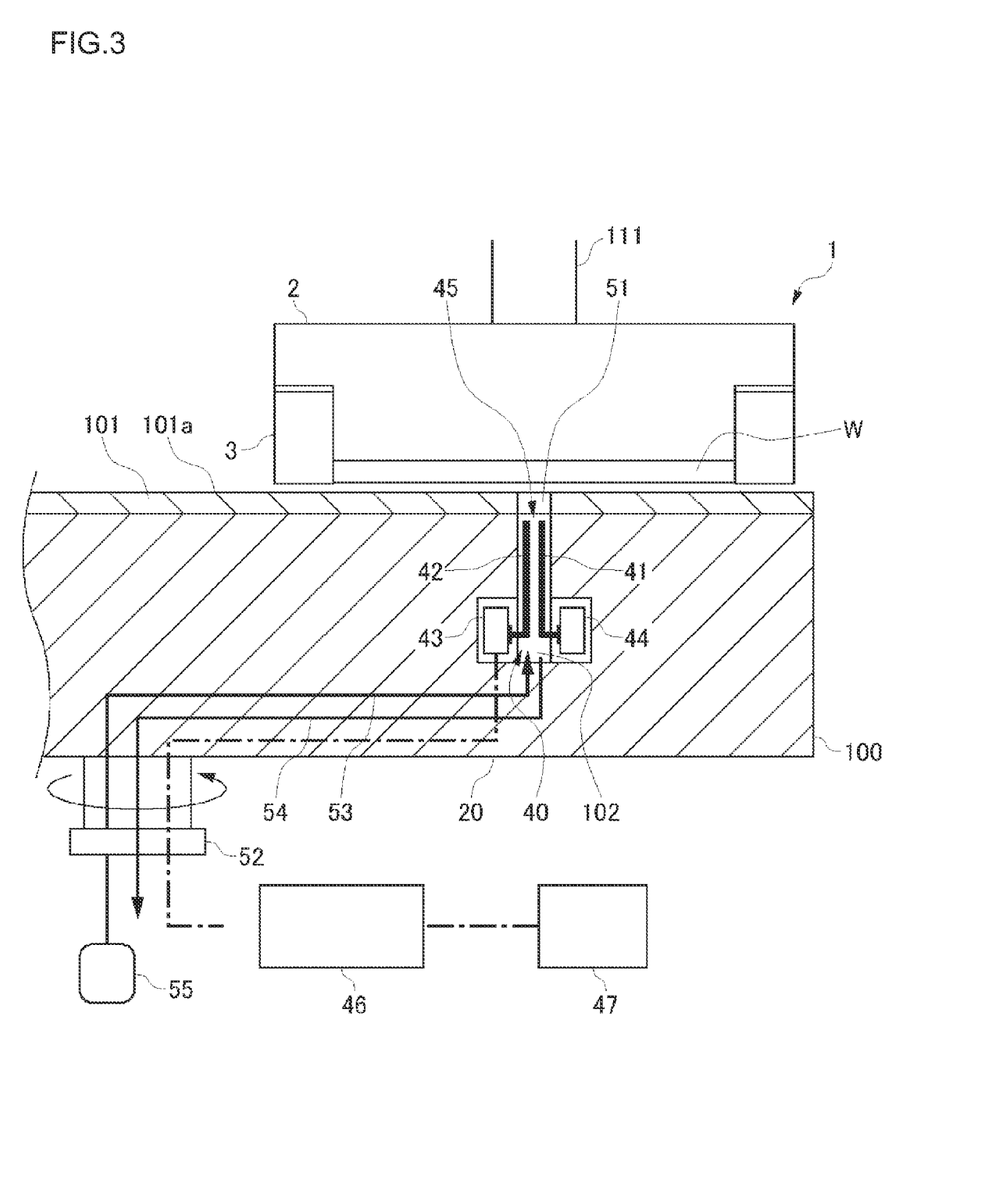
FIG. 3 is a schematic sectional view showing main components of a polishing table according to an embodiment.

FIG. 3 is a schematic sectional view showing main components of the polishing table 100. The polishing table 100 has a hole 102 open to the top surface thereof formed therein. The polishing pad 101 has a vent hole 51 formed in a position corresponding to the hole 102. The hole 102 and the vent hole 51 are communicatively connected. The vent hole 51 is open to the polishing surface 101a. The hole 102 is connected to a liquid supply source 55 via a liquid supply path 53 and a rotary joint 52. Water (preferably, pure water) as a transparent liquid is supplied from the liquid supply source 55 to the hole 102 during polishing. The water fills a space formed by the undersurface of the semiconductor wafer W and the vent hole 51 and discharged through a liquid discharge path 54. The polishing liquid is discharged together with the water and an optical path is thereby secured. A valve (not shown) operating in synchronization with rotation of the polishing table 100 is provided in the liquid supply path 53. The valve stops the flow of water or operates to reduce the flow rate of water when the semiconductor wafer W is not positioned above the vent hole 51.

The polishing device includes a thickness measuring unit 40 that measures the thickness of the substrate. The thickness measuring unit 40 is an optical thickness sensor including a light source 44 that emits light, a projecting unit 41 that irradiates the surface of the semiconductor wafer W with light emitted from the light source 44, a light receiving unit 42 that receives reflected light returning from the semiconductor wafer W, a spectroscope 43 that resolves reflected light from the semiconductor wafer W into a wavelength to measure the intensity of the reflected light in a predetermined range of wavelength, and a processing unit 46 that generates a spectrum from measurement data acquired by the spectroscope 43 and determines the thickness of the semiconductor wafer W based on the spectrum. The spectrum shows the intensity of light distributed in a predetermined range of wavelength and shows the relationship between the intensity and wavelength of light.

The projecting unit 41 and the light receiving unit 42 is formed of optical fibers. The projecting unit 41 and the light receiving unit 42 constitute an optical head (optical thickness measuring head) 45. The projecting unit 41 is connected to the light source 44. The light receiving unit 42 is connected to the spectroscope 43. As the light source 44, a light source that emits light of a plurality of wavelengths such as a light-emitting diode (LED), a halogen lamp, and a xenon flash lamp can be used. The projecting unit 41, the light receiving unit 42, the light source 44, and the spectroscope 43 are arranged inside the polishing table 100 and rotate together with the polishing table 100. The projecting unit 41 and the light receiving unit 42 are arranged inside the hole 102 formed in the polishing table 100 and the tip of each is positioned near the surface to be polished of the semiconductor wafer W.

The projecting unit 41 and the light receiving unit 42 are arranged in a direction perpendicular to the surface of the semiconductor wafer W and the projecting unit 41 irradiates the surface of the semiconductor wafer W with light in a vertical direction. The projecting unit 41 and the light receiving unit 42 are arranged opposite to the center of the semiconductor wafer W held by the top ring 1. Therefore, each time the polishing table 100 rotates, the tips of the projecting unit 41 and the light receiving unit 42 move across the semiconductor wafer W so that the region including the center of the semiconductor wafer W is irradiated with light. This is intended to measure the thickness of the entire surface of the semiconductor wafer W including the thickness in the center of the semiconductor wafer W by passing the projecting unit 41 and the light receiving unit 42 through the center of the semiconductor wafer W. The processing unit 46 can generate a thickness profile (thickness distribution in the radial direction) based on the measured thickness data. The processing unit 46 is connected to the control unit 500 (see FIG. 1) and outputs the generated thickness profile to the control unit 500.

The semiconductor wafer W is irradiated with light from the projecting unit 41 during polishing of the semiconductor wafer W. The light from the projecting unit 41 is reflected by the surface of the semiconductor wafer W and received by the light receiving unit 42. Water is supplied to the hole 102 and the vent hole 51 while the semiconductor wafer W is irradiated with light and the space between each tip of the projecting unit 41 and the light receiving unit 42 and the surface of the semiconductor wafer W is thereby filled with water. The spectroscope 43 resolves reflected light sent from the light receiving unit 42 into a wavelength to measure the intensity of the reflected light by wavelength. The processing unit 46 generates a spectrum showing the relationship between the intensity and wavelength of reflected light from the intensity of the reflected light measured by the spectroscope 43. Further, the processing unit 46 estimates the current thickness profile (remaining film profile) of the semiconductor wafer W from the obtained spectrum using a publicly known technology.

Instead of the thickness measuring unit 40 including the above optical thickness sensor, the polishing device may include thickness measuring units of other methods. Thickness measuring units of other methods include, for example, an eddy-current type thickness sensor arranged inside the polishing table 100 to acquire a thickness signal that changes in accordance with the thickness of the semiconductor wafer W. The eddy-current type thickness sensor rotates together with the polishing table 100 to acquire a thickness signal of the semiconductor wafer W held by the top ring 1. The eddy-current type thickness sensor is connected to the control unit 500 shown in FIG. 1 and a thickness signal acquired by the eddy-current type thickness sensor is sent to the control unit 500. The control unit 500 generates a thickness index value that directly or indirectly represents the thickness from the thickness signal.

The eddy-current type thickness sensor is configured to detect the thickness of a conductive film from changes in impedance caused by a magnetic field of an eddy current induced in the conductive film by passing a high-frequency AC current to a coil. As an eddy-current sensor, a publicly known eddy-current sensor described in JP 2014-017418 A can be used.

In the above example, the vent hole 51 is provided in the polishing surface 101a and also the liquid supply path 53, the liquid discharge path 54, and the liquid supply source 55 are provided to fill the hole 102 with water, but instead, a transparent window may be formed in the polishing pad 101. In this case, the projecting unit 41 irradiates the surface of the substrate W on the polishing pad 101 through the transparent window and the light receiving unit 42 receives reflected light from the semiconductor wafer W through the transparent window.

A polishing operation of the polishing device configured as described above will be described. The top ring 1 receives the semiconductor wafer W from a substrate delivery device (pusher) and holds the semiconductor wafer W on the undersurface thereof by vacuum suction. At this point, the top ring 1 is held such that the surface to be polished is opposed to the surface of the polishing pad 101 by pointing the surface to be polished (the surface on which a device is normally configured and is also called a "front side") downward. The top ring 1 holding the semiconductor wafer W on the undersurface is moved from the receiving position of the semiconductor wafer W to above the polishing table 100 by turning of the top ring head 110 caused by rotation of the top ring head shaft 117.

Then, the top ring 1 holding the semiconductor wafer W by vacuum suction is lowered to a preset position for polishing of the top ring. While the retainer ring 3 is installed on the surface (polishing surface) 101a of the polishing pad 101 in the preset position for polishing, before the polishing, the top ring 1 holds the semiconductor wafer W by suction and there is a slight gap (for example, about 1 mm) between the undersurface (surface to be polished) of the semiconductor wafer W and the surface (polishing surface) 101a of the polishing pad 101. At this point, both of the polishing table 100 and the top ring 1 are driven to rotate and a polishing liquid is supplied from the polishing liquid supply nozzle 60 installed above the polishing table 100 onto the polishing pad 101.

In this state, the surface to be polished of the semiconductor wafer W is pressed against the surface (polishing surface) 101a of the polishing pad 101 by swelling the membrane 4 on the back side of the semiconductor wafer W to press the back side of the surface to be polished of the semiconductor wafer W and the surface to be polished of the semiconductor wafer W is polished by the polishing surface 101a of the polishing pad 101 by relatively sliding the surface to be polished of the semiconductor wafer W and the polishing surface of the polishing pad 101 until the surface to be polished of the semiconductor wafer W becomes a predetermined state (for example, a predetermined thickness). After the wafer process on the polishing pad 101 is finished, the semiconductor wafer W is sucked by the top ring 1 and the top ring 1 is lifted and moved to the substrate delivery device constituting a substrate transportation mechanism before the wafer W being released.

Figure 4:
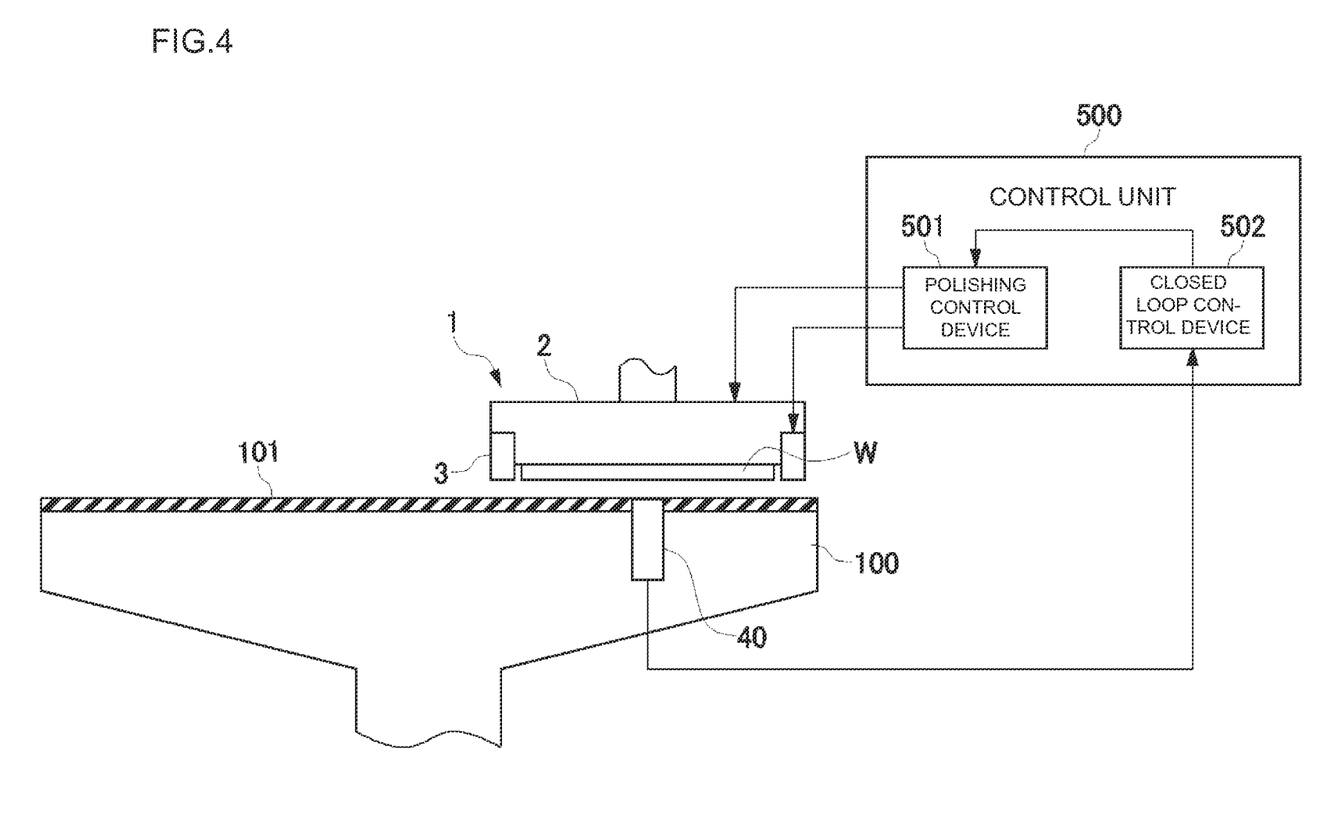
FIG. 4 is a diagram showing the configuration of the polishing device to control a polishing operation according to an embodiment.

Next, the control of the polishing operation based on a thickness profile measured by the thickness measuring unit 40 will be described. FIG. 4 is a diagram showing the configuration of the polishing device to control a polishing operation. The polishing device includes a polishing control device 501 and a closed loop control device 502. The polishing control device 501 and the closed loop control device 502 corresponds to the aforementioned control unit 500 (see FIG. 1).

Figure 5:
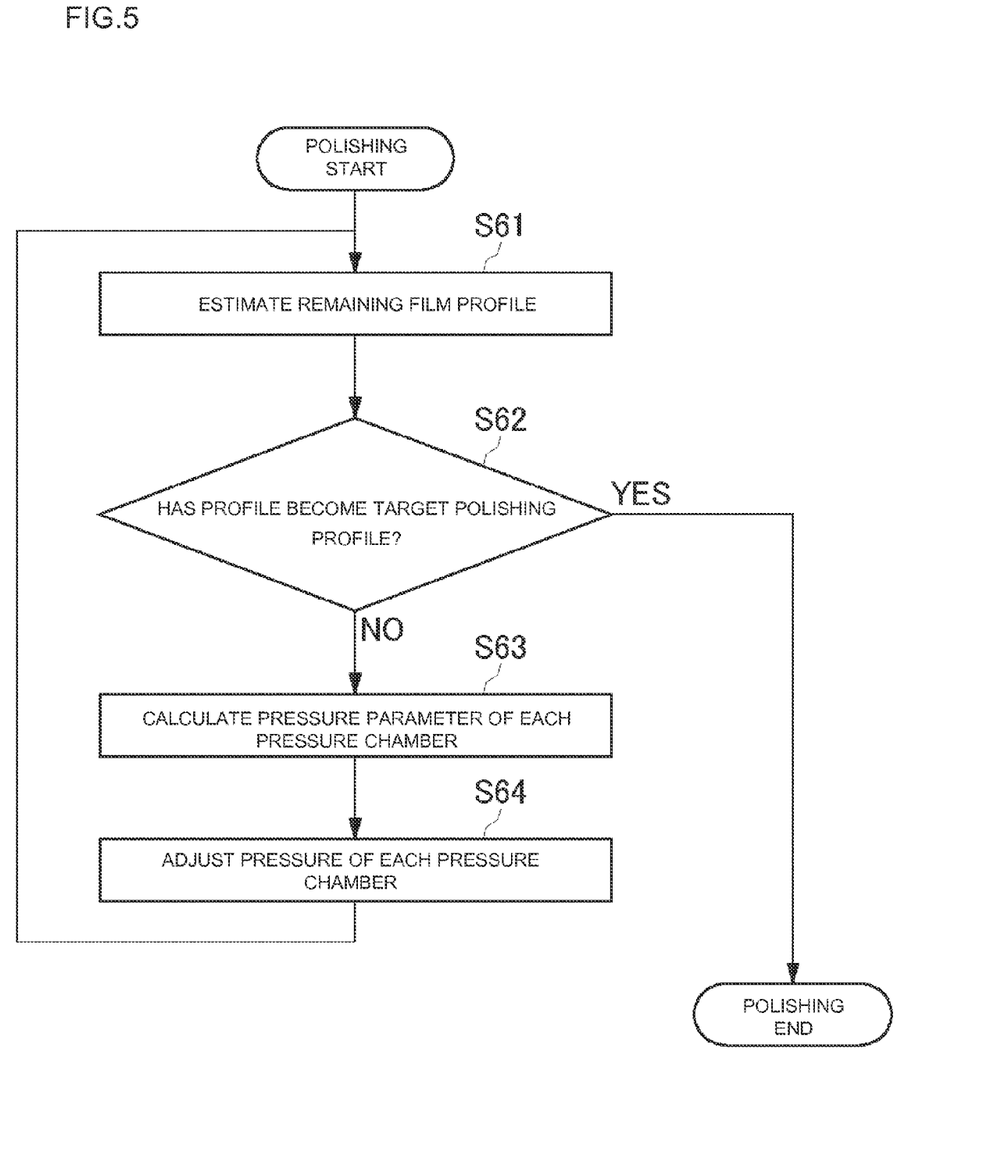
FIG. 5 is a flow chart of polishing control by the polishing device according to an embodiment.

FIG. 5 is a flowchart of polishing control of a polishing device according to the present embodiment. When the polishing device starts to polish, the thickness measuring unit 40 estimates a remaining film profile and outputs the estimated value to the closed loop control device 502 (step S61). The closed loop control device 502 determines whether the remaining film profile has become the target thickness profile (step S62). If the remaining film profile estimated by the thickness measuring unit 40 has become the target thickness profile (YES in step S62), the polishing process is terminated. The target thickness profile may be a completely flat shape (uniform thickness over the entire surface) or an uneven or sloped shape.

If the estimated remaining film profile has not yet become the target thickness profile (NO in step S62), the closed loop control device 502 calculates a parameter (pressure parameter) of the pressure of a fluid supplied to the center chamber 5, the ripple chamber 6, the outer chamber 7, the edge chamber 8, and the retainer ring pressure chamber 9 (hereinafter, generically called the "pressure chamber") based on the estimated remaining film profile and outputs the parameter to the polishing control device 501 (step S63). The polishing control device 501 adjusts the pressure of the fluid supplied to each pressure chamber following the pressure parameter (step S64). The polishing device repeats steps S61 to S64 described above in a fixed period until the estimated remaining film profile becomes the target thickness profile (until NO in step S62). Incidentally, the pressure chamber corresponds to a pressing unit of the present invention.

Hereinafter, the calculation of the pressure parameter of each pressure chamber based on the remaining film profile in step S63 described above will be described by taking a portion related to an edge region of the semiconductor wafer W as an example. First, the closed loop control device 502 acquires a known relationship with an edge region polishing rate MRR_Edge. The relationship between the edge region polishing rate MRR_Edge and the pressure parameter of each pressure chamber is generally expressed by Formula (1) shown below using a function F.

$$MRR\_Edge = F(AP\_Edge, RRP, etc \ldots) \quad (1)$$

where AP_Edge is the pressure (edge chamber pressure) of the edge chamber 8 as a pressure chamber in an edge region. RRP is the pressure (retainer ring pressure) of the retainer ring pressure chamber 9. Other parameters ("etc" of Formula (1)) affecting the polishing rate of an edge region include, for example, the pressure of the outer chamber 7 as a neighboring pressure chamber closer to the center side of the semiconductor wafer W than the edge chamber 8.

The function F is generally a linear expression of each parameter or a statistical multiple regression expression including an interaction of each parameter of such a linear expression, but may also be a special function such as an expression of the order n of each parameter. In any case, constants accompanying each parameter need to be known.

Next, the closed loop control device 502 acquires the target polishing rate MRR_Tgt at each point in time during polishing of an edge region as a region to be controlled from calculated values by the closed loop control device 502. Then, the closed loop control device 502 substitutes the obtained target polishing rate MRR_Tgt into Formula (1) and modifies the formula to determine the retainer ring pressure RRP at each point in time like Formula (2) shown below:

$$RRP = G(MRR\_Tgt, AP\_Edge, etc \ldots) \quad (2)$$

The closed loop control device 502 determines whether the retainer ring pressure RRP calculated by Formula (2) shown above falls below a threshold value and if the calculated retainer ring pressure RRP falls below the threshold value, adopts the threshold value preferentially. The threshold value is set as a value that may make it impossible for the retainer ring 3 to hold the semiconductor wafer W if the retainer ring pressure RRP falls below the value and by adopting the threshold value preferentially, the semiconductor wafer W can be prevented from slipping out from a retainer ring. As a threshold value, an absolute value may be adopted or a value in accordance with the average (for example, a value obtained by multiplying the average by a predetermined coefficient equal to 1 or less) of pressure of each pressure chamber may be adopted.

Figure 6:
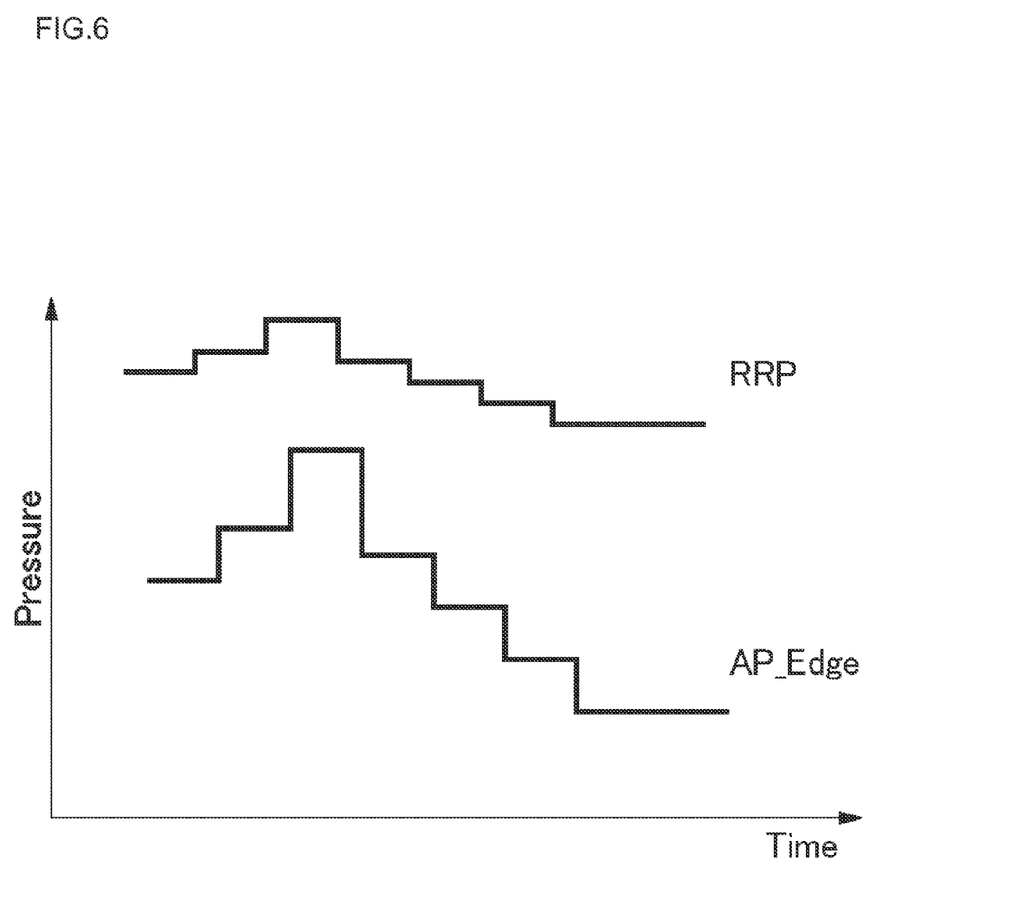
FIG. 6 is a graph showing pressure changes of a pressure chamber according to an embodiment.

In the polishing device according to the present embodiment, as described above, by adjusting the pressure AP_Edge of the edge chamber 8 during polishing of the semiconductor wafer W, not only a pressing force of the edge region is controlled, but also the pressure RRP of the retainer ring 3 affecting the polishing pressure (pressing force) of the surface to be polished of the semiconductor wafer W on the polishing surface 101a as a periphery of the edge chamber 8 is controlled. That is, the polishing rate of an edge region of the semiconductor wafer W is normally affected by a rebound of the polishing pad and the like and has an accompanying control parameter such as the retainer ring pressure or the like to deal with the above problem, but such an accompanying control parameter is not controlled in real time during polishing in the past. In contrast, to control polishing of an edge region of the semiconductor wafer W, the polishing device according to the present embodiment changes, as shown in FIG. 6, not only the pressure AP_Edge of the edge chamber 8 as a pressure chamber corresponding to the region during polishing, but also the pressure RRP of the retainer ring 3 in the periphery thereof from the relationship between the pressure parameter of the edge chamber 8 and each pressure chamber and the edge region polishing rate. Accordingly, a desired thickness profile can be achieved with high precision.

A polishing device that controls the thickness profile in real time to achieve a desired thickness profile has been proposed by measuring the thickness of the semiconductor wafer, and controlling the pressure of the plurality of the pressure chambers during the polishing, but compared with this proposal, the present embodiment controls, as described above, not only the pressure of the membrane 4 in real time, but also the retainer ring 3 as a periphery thereof in real time and therefore, a more precise thickness profile can be controlled.

Figure 7:
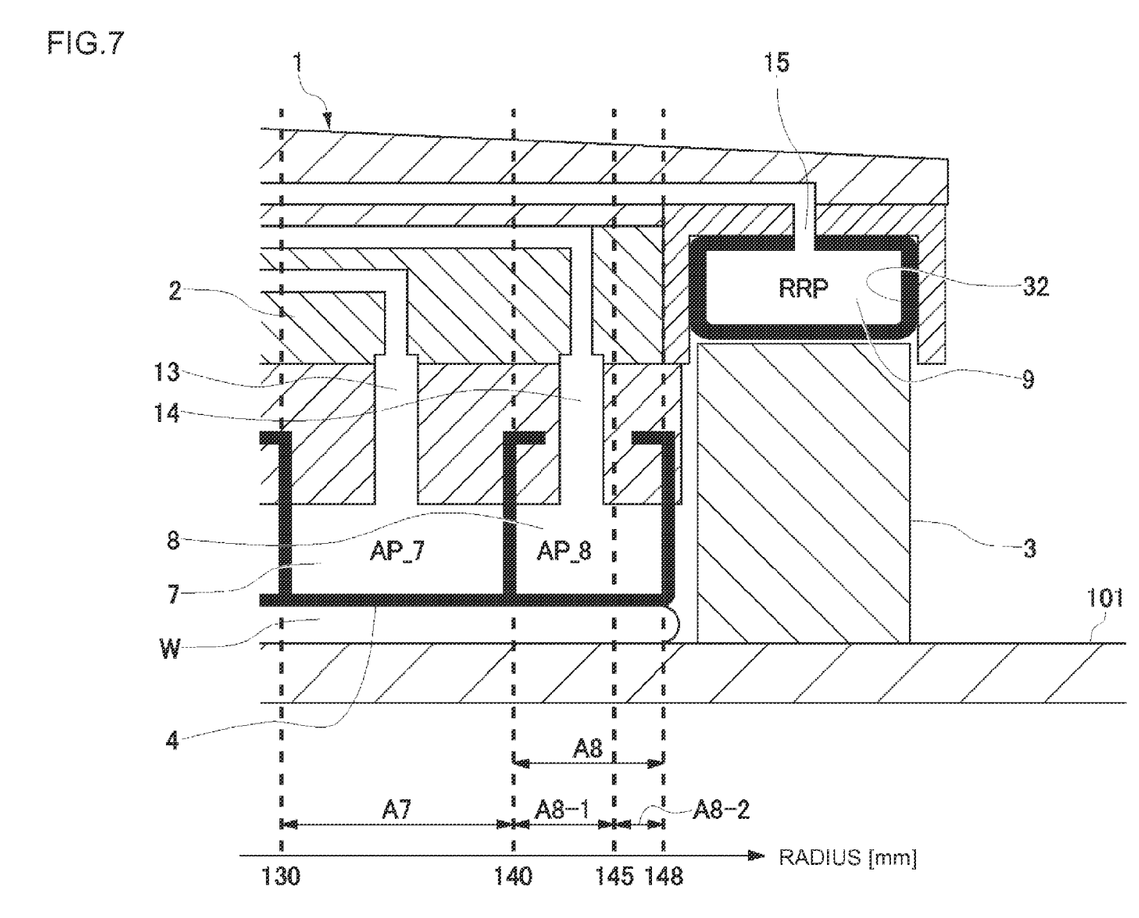
FIG. 7 is a schematic sectional view showing main components of the top ring according to an embodiment.

A concrete example of the calculation of the above pressure parameter will be described below. FIG. 7 is a schematic sectional view showing main components of the top ring 1. As shown in FIG. 7, a region (radius: 130 to 140 mm) corresponding to the outer chamber 7 in the semiconductor wafer W is denoted as a region A7. A region A8 (radius: 140 to 148 mm) corresponding to the edge chamber 8 is divided into a region A8-1 (radius: 140 to 145 mm) where only the pressure AP_8 of the edge chamber 8 affects the polishing pressure and a region A8-2 (radius: 145 to 148 mm) affected by the pressure AP_8 of the edge chamber 8 and the pressure RRP of the retainer ring 3.

If the polishing rate of the region A8-1 at each point in time is denoted as MRR_8(t) and the polishing rate of the region A8-2 is denoted as MRR_Edge(t), first the polishing rate MRR_8(t) of the region A8-1 is proportional to the pressure AP_8 (t) of the edge chamber 8. The polishing rate MRR_Edge (t) of the region A8-2 is determined by a function using AP_8(t) and RRP(t) as variables, but it is experimentally assumed here that, as shown in Formula (3) below, the polishing rate is determined by a linear expression of AP_8(t) and RRP(t).

$$MRR\_Edge(t) = a \times AP\_8(t) + b \times RRP(t) + c \quad (3)$$

where a, b, and c are constants determined experimentally.

The control pressure AP_8(t) in the region A8-1 at each point in time is determined by the closed loop control device 502. The target polishing rate MRR_8(t) at time t can be calculated like Formula (4) shown below using the control pressure AP_8(t).

$$MRR\_8(t) = G\_8 \times AP\_8(t) \quad (4)$$

where G_8 is the gain for the polishing rate of the pressure of an area 8.

To planarize the region A8 of the semiconductor wafer W, the polishing rate of the region A8-1 and the polishing rate of the region A8-2 may be made equal. That is, Formula (5) shown below may be satisfied.

$$MRR\_Edge(t) = MRR\_8(t) \quad (5)$$

Substituting Formula (3) and Formula (4) into Formula (5) yields Formula (6) shown below.

$$A \times AP\_8(t) + b \times RRP(t) + c = G\_8 \times AP\_8(t) \quad (6)$$

The retainer ring pressure RRP(t) at each point in time can be obtained like Formula (7) shown below after modifying Formula (6).

$$RRP(t) = 1/b \times (G\_8 - a) \times AP\_8(t) - c/b \quad (7)$$

Formula (7) corresponds to Formula (2) shown generally above and signifies that real-time control of not only the pressure AP_8(t) of the edge chamber 8 corresponding to the region A8, but also the retainer ring pressure RRP(t) fitting thereto is performed to planarize the edge region A8 of the semiconductor wafer W.

The method of determining the retainer ring pressure RRP(t) from the relationship between the pressure of the edge chamber and periphery retainer ring and the polishing rate of the edge region at each point in time during polishing is shown above. However, the method of determining the pressure in the periphery is not limited to the above method. Another example of the method of determining the pressure in the periphery will be described below.

Figure 8:
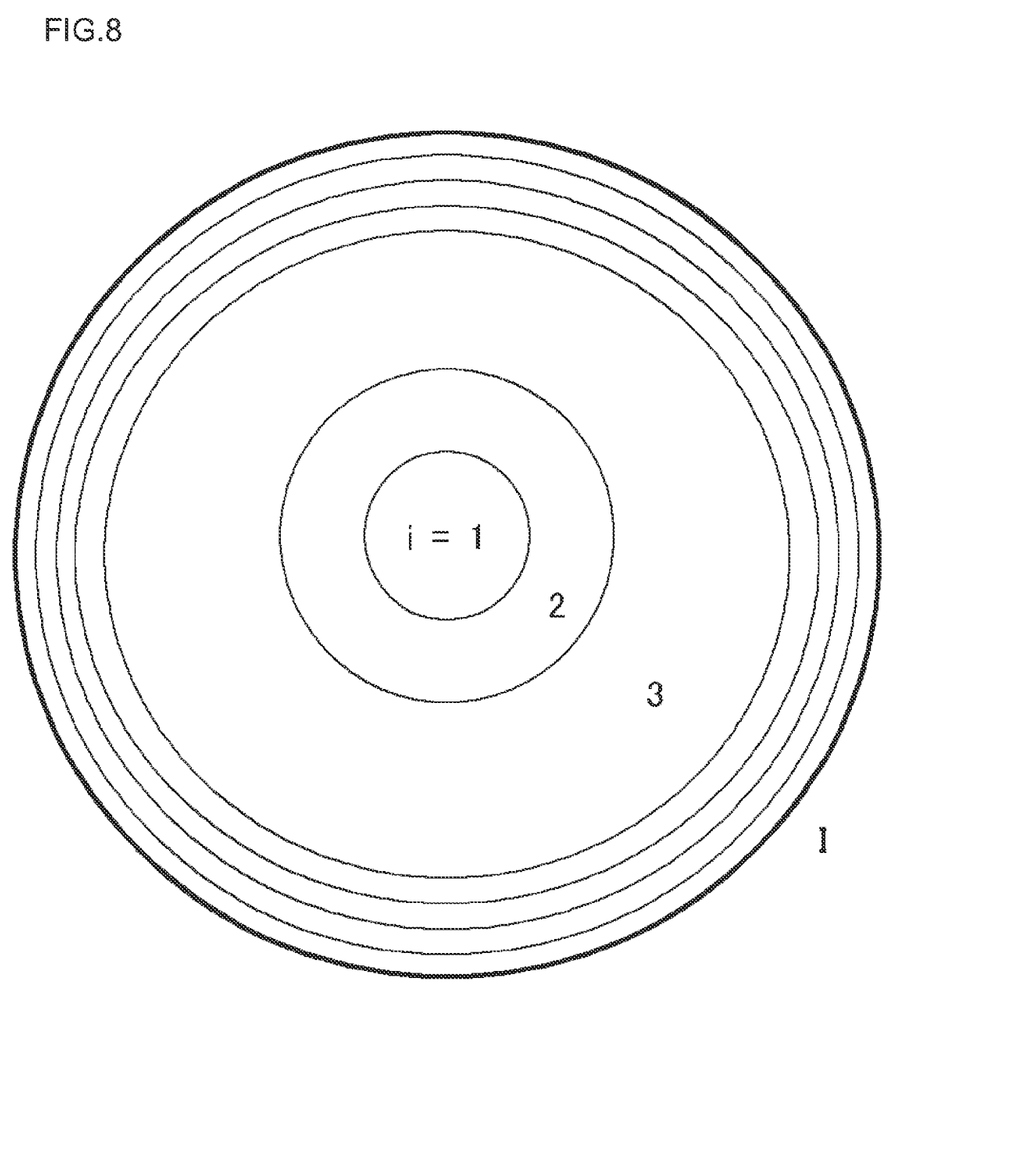
FIG. 8 is a diagram showing a numbering order of a plurality of concentric regions of a substrate surface according to an embodiment.

The relationship between the pressure of each pressure chamber and the polishing rate in Formula (3) can be generalized to the expression of Formula (8) shown below:

[Mathematical Formula 1]

$$\text{MRR\_i}(t) = \sum_{j=1}^{J} a_{ij} \text{AP\_j}(t) + b_i \quad (8)$$

$$i = 1, 2, \ldots, I$$

where MRR_i(t) is the polishing rate in a concentric region i on the substrate numbered in ascending order by setting, as shown in FIG. 8, 1 to the center thereof. AP_j is a pressure j numbered successively from the center like j=1 for the center chamber and j=2 for the ripple chamber and after the edge chamber, at least one pressure of the periphery is allocated. $a_{ij}$ is a constant of proportionality showing the relationship of the polishing rate of each region with each pressure and $b_i$ is an offset of the polishing rate for the region i. The polishing rate is generally determined by the pressure of the opposed pressure chamber on the center side of the substrate and the region i may be defined by associating with the corresponding pressure chamber and in the periphery, it is preferable to divide finely to be able to express a rapid change of the thickness profile.

If MRR(t) is a column vector of a length I, AP(t) is a column vector of a length J, A is an I×J matrix, and B is a column vector of the length I, MRR(t) can be represented like Formula (9) shown below:

$$MRR(t) = A \cdot AP(t) + B \quad (9)$$

The matrix A is relatively sparse like a diagonal matrix on the center side of the substrate, that is, in an upper left portion and is relatively dense on the edge side of the substrate, that is, in a lower right portion as the effect of the pressure in the periphery is shown. Each element of the matrix A can be determined by, as described above, an experiment in which each pressure is changed and a multiple regression analysis. Alternatively, regarding each region on the center side of the substrate, the polishing rate is almost determined by the pressure of the opposed pressure chamber and the value of the corresponding element may be determined from the polishing rate of the relevant region when a sample wafer is polished and the pressure of the opposed pressure chamber. When the offset of the polishing rate can be ignored, the corresponding element of the vector B is set to 0.

When the relationship of the polishing rate with each pressure in Formula (9) is determined as described above, closed loop control including the periphery of the substrate can be constituted regarding the distribution of the remaining thickness based on the relationship. Hereinafter, an example of applying model based predictive control by assuming, in addition to the relationship of Formula (9), further that the response to each pressure of the polishing rate (amount of decrease in thickness per unit time) of each region of the wafer surface has a dead time and a primary delay will be described. A thickness y(k) is represented by Formula (10) shown below using $f_1$ as an appropriate function.

$$y(k) = y(0) - A \cdot f_1(k, \Delta t, t_D, \alpha, u_0, \Delta u(1), \Delta u(2), \ldots, \Delta u(k-1)) - k\Delta t \cdot B \quad (10)$$

where y(k) is the thickness and a column vector of the length I, A is a constant of proportionality of the polishing rate for the pressure and is a matrix of the size I×J, k is a discrete time and k=0, 1, 2, ..., Δt is a time increment (control period), $t_D$ is a dead time of the response, α is a time constant of the response, $u_0$ is an initial pressure and a column vector of the length J, and Δu(k) is the amount of change of the pressure at time k and a column vector of the length J.

A predicted value p steps forward of the thickness at time k is represented like Formulas (11) to (13) using $f_2$ and $f_3$ as appropriate functions:

$$y_P(k,p) = y_O(k,p) + y_F(k,p) \quad (11)$$

$$y_O(k,p) = y(k) - A \cdot f_2(k, \Delta t, t_D, \alpha, u_0, \Delta u(1), \Delta u(2), \ldots, \Delta u(k-1), p) - p\Delta t \cdot B \quad (12)$$

$$y_F(k,p) = -A \cdot f_3(k, \Delta t, t_D, \alpha, \Delta u(k), \Delta u(k+1), \ldots, \Delta u(k+p-1), p) \quad (13)$$

where $y_F(k, p)$ is a predicted value p steps forward of the thickness at time k and a column vector of the length I, $y_O(k,p)$ is a defined item determined by the amount of operation (pressure) in the past and a column vector of the length I, and $y_F(k, p)$ is an undefined item determined by the amount of operation (pressure) from the current time onward and a column vector of the length I.

Thus, if $$y_P(k,P) = [y_P(k,1)^T, y_P(k,2)^T, \ldots, y_P(k,P)^T]^T \quad (14)$$

$$y_O(k,P) = [y_O(k,1)^T, y_O(k,2)^T, \ldots, y_O(k,P)^T]^T \quad (15)$$

$$\Delta U_Q = [\Delta u(k)^T, \Delta u(k+1)^T, \ldots, \Delta u(k+Q-1)^T]^T \quad (16)$$

are set and Ψ is used as an appropriate matrix of (I×P)×(J×Q), a predicted value $Y_P(k, P)$ p steps forward of the thickness can be represented like Formula (17) shown below:

$$Y_P(k,P) = Y_O(k,P) - \Psi \Delta U_Q \quad (17)$$

To inhibit changes of the amount of operation (pressure) after the passage of a sufficiently long time, Formula (18) shown below is assumed under the condition of 1≤Q≤P.

$$\Delta u(k+Q) = \Delta u(k+Q+1) = \ldots = \Delta u(k+P-1) = 0 \quad (18)$$

If Q=P, Formula (18) can be interpreted as Δu(k+Q)=0.

Figure 9:
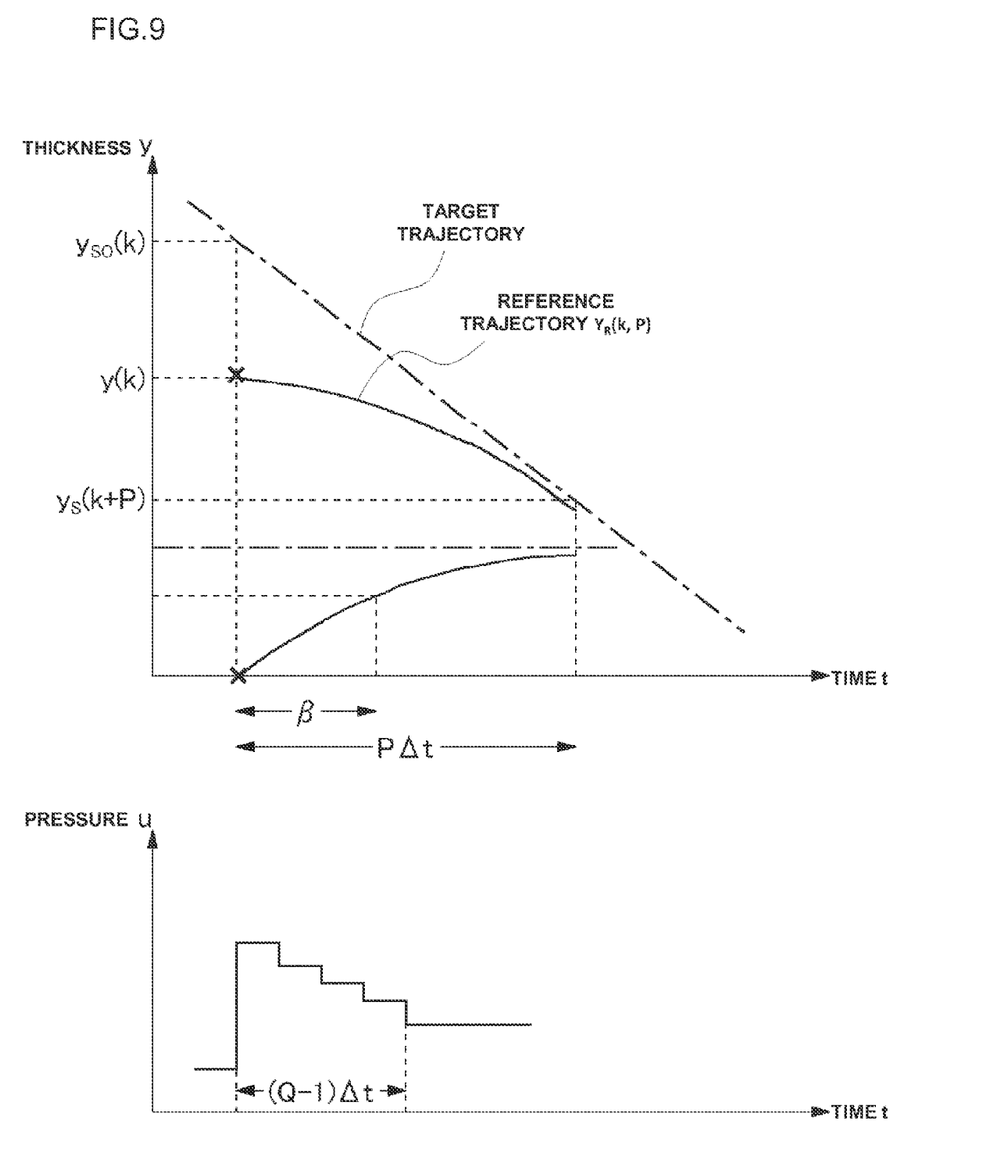
FIG. 9 is a graph showing a reference trajectory of model prediction control according to an embodiment.

After the above preparations, a reference trajectory of the model based predictive control is defined. As shown in FIG. 9, $y_{S0}(k)$ represents the target thickness at each time k and β represents the time constant of the predetermined primary delay. A reference trajectory $Y_R(k, P)$ of the model based predictive control is defined as shown below:

$$Y_R(k,P) = [y_R(k,1)^T, y_R(k,2)^T, \ldots, y_R(k,P)^T]^T \quad (19)$$

$$y_R(k,p) = y_S(k+p) + \exp(-p\Delta t/\gamma)[y(k) - y_S(k)] \quad (20)$$

$$y_S(k+p) = [y_{S0}(k+p), y_{S0}(k+p), \ldots, y_{S0}(k+p)]^T \quad (21)$$

where Formula (21) is a column vector of the length I.

An evaluation function J to asymptotically bring the amount of control (thickness) closer to the target trajectory along the reference trajectory while inhibiting changes of the amount of operation (pressure) can be defined as shown below:

[Mathematical Formula 2]

$$J = \| Y_R(k, P) - Y_P(k, P) \|^2_{\Gamma^T\Gamma} + \| \Delta U_Q \|^2_{\Lambda^T\Lambda} \quad (22)$$
$$= \| Y_R(k, P) - Y_0(k, P) + \Psi \Delta U_Q \|^2_{\Gamma^T\Gamma} + \| \Delta U_Q \|^2_{\Lambda^T\Lambda}$$

where (23)
$$\| X \|^2_A = X^T A X$$

$$\Gamma^T \Gamma = \begin{pmatrix} \gamma_1^T \gamma_1 & 0 & 0 & \cdots & 0 \\ 0 & \gamma_2^T \gamma_2 & 0 & \cdots & 0 \\ 0 & 0 & \gamma_3^T \gamma_3 & \cdots & 0 \\ & \cdots & \cdots & & \\ 0 & 0 & 0 & \cdots & \gamma_P^T \gamma_P \end{pmatrix} \quad (24)$$

$$\Lambda^T \Lambda = \begin{pmatrix} \lambda_1^T \lambda_1 & 0 & 0 & \cdots & 0 \\ 0 & \lambda_2^T \lambda_2 & 0 & \cdots & 0 \\ 0 & 0 & \lambda_3^T \lambda_3 & \cdots & 0 \\ & \cdots & \cdots & & \\ 0 & 0 & 0 & \cdots & \lambda_Q^T \lambda_Q \end{pmatrix} \quad (25)$$

$\gamma_p$(p=1, . . . , P) in Formula (24) is a I×I diagonal matrix representing the weight for a deviation of the predicted value from the reference trajectory at time (k+p) and $\lambda_q$(q=1, . . . , Q) in Formula (25) is a J×J diagonal matrix representing the weight for changes of the amount of operation at time (k+q−1).

Constraints are normally imposed on the amount of operation (pressure) such as upper and lower limits, upper and lower limits of changes at a time, and an upper limit of a pressure difference between neighboring pressure chambers. In this case, an amount of operation $\Delta U_Q$ that minimizes the value of J in Formula (13) can be determined by quadratic programming as a kind of optimization. In this manner, the amounts of operation of the pressure of each pressure chamber and the periphery are determined as optimal values at the same time in each control period and therefore, more precise control can be expected.

Incidentally, in Formula (10) and thereafter, y(k) may not necessarily be an absolute value if the thickness is relatively represented. For example, when a sample wafer is polished, the thickness can relatively be represented by the remaining time till the end of the polishing. In such a case, the matrix A and the vector B are appropriately transformed such that no contradiction arises.

In the concrete example described above, the degree of flatness can be improved by correcting an imbalance of the polishing rate in a region (region A8) corresponding to one pressure chamber (edge chamber 8). That is, when the semiconductor wafer W is divided into regions using a membrane divided into a plurality of pressure chambers to press the wafer against the polishing pad, if unevenness that cannot be ignored is present in the remaining film profile in a region, the unevenness may not be removable only by the pressure from the pressure chamber of the applicable region and such a tendency is particularly noticeable in an edge region of the semiconductor wafer W.

In such a case, the remaining film profile of the applicable region is controlled by controlling not only the pressure of each pressure chamber, but also a parameter of the periphery such as the retainer ring pressure, but this idea does not take the real-time control function during polishing into consideration. In the above embodiment, by contrast, the above problem of the profile control of an edge region is solved by incorporating a parameter of a periphery such as the retainer ring pressure affecting the polishing rate and the remaining film profile of the edge region into parameters of real-time control. Such profile control of the embodiment is particularly effective for an edge portion for which it is difficult to control the thickness profile. According to a polishing device in the present invention, as described above, a semiconductor wafer as an object to be polished can be polished with precision up to an outermost circumferential portion thereof.

In the above embodiment, together with the pressure AP_8 of the edge chamber 8, the retainer ring pressure RRP of the retainer ring 3 on the outer side as the periphery thereof is controlled to planarize the region A8 as an edge region, but in addition thereto or instead thereof, the pressure AP_7 of the outer chamber 7 on the inner side may be controlled as the periphery of the edge chamber 8.

Also in the above embodiment, an example of planarizing the region A8 as an edge region is described, but when the thickness profile of another region is controlled, the present invention can similarly be applied. For example, to planarize the outer chamber 7, together with the pressure AP_7 of the outer chamber 7, the pressure AP_8 of the edge chamber 8 on the outer side may be controlled as a periphery thereof.

Also in the above embodiment, to planarize some region, the pressure of a pressure chamber in the periphery thereof is controlled together with the pressure of the pressure chamber corresponding to the region, but in addition thereto or instead thereof, a parameter of another member in the periphery may be controlled. The periphery of a region to be controlled may be, for example, a mechanism that controls the deformation of the membrane 4 or the pressure of the surface to be polished of the semiconductor wafer W through the deformation of the membrane 4 by adjusting the overall height (membrane height) of the membrane 4.

Also in the above embodiment, the pressure parameter of each pressure chamber is calculated by the closed loop control device 502, but the calculation may also be done by the polishing control device 501. In such a case, constants and the like to calculate the pressure parameter from the remaining film profile may be passed from the closed loop control device 502 to the polishing control device 501.

Also in the above embodiment, a pressure chamber made of a membrane is used as a pressing unit that presses the back side of the surface to be polished of a semiconductor wafer, but the pressing unit of the present invention is not limited to such an example and a different structure (for example, a spring) capable of controlling a pressing force on the back side of the semiconductor wafer may also be used.

According to the above embodiment, the pressing force of the surface to be polished of a portion pressed directly by the pressing unit against the polishing member is controlled not only by the control of the pressing by the pressing unit, but also by the control of the pressing of the surface to be polished of the portion by the periphery against the polishing member and therefore, highly precise polishing can be performed.

We claim:

1. A polishing device that polishes a surface to be polished of an object to be polished by relatively sliding the surface to be polished and a polishing member, comprising:
    a pressing unit that presses the surface to be polished against the polishing member by pressing a back side of the surface to be polished of the object to be polished;
    a thickness measuring unit that estimates a remaining film profile of the surface to be polished of the object to be polished during polishing of the object to be polished; and a control unit that controls a pressing force on the back side of the surface to be polished by the pressing unit in accordance with a measurement result by the thickness measuring unit during the polishing of the object to be polished, wherein the control unit controls not only the pressing force by the pressing unit during the polishing of the object to be polished, but also a periphery of the pressing unit affecting a pressing force of the surface to be polished on the polishing member during the polishing, and the control unit calculates a pressing force of the periphery during the polishing using a relationship of the pressing unit and the periphery with a polishing rate of the surface to be polished whose back side is directly pressed by the pressing unit.

2. The polishing device according to claim 1, wherein the periphery is a retainer member that presses the polishing member near the pressing unit, and the control unit controls not only the pressing force on the back side of the surface to be polished by the pressing unit, but also a pressing force on the polishing member by the retainer member.

3. The polishing device according to claim 2, wherein the pressing unit presses an edge region on the back side of the surface to be polished of the object to be polished, and the retainer member is a member surrounding the object to be polished.

4. The polishing device according to claim 1, further comprising: a plurality of the pressing units that partially presses the back side of the surface to be polished of the object to be polished, wherein the periphery is the other neighboring pressing unit.

5. The polishing device according to claim 1, wherein the periphery is a mechanism that controls the pressing force of the surface to be polished by deformation of an elastic body of the pressing unit.

6. The polishing device according to claim 1, wherein the periphery is a mechanism that controls deformation of an elastic body of the pressing unit.

7. The polishing device according claim 2, wherein the control unit controls a pressing force of the periphery such that a thickness profile of the surface to be polished becomes uniform or a desired shape over an entire surface of the surface to be polished.

8. The polishing device according claim 2, wherein the control unit controls a pressing force of the periphery such that a thickness profile of the surface to be polished becomes uniform or a desired shape in a region of the surface to be polished whose back side is directly pressed by the pressing unit.

9. The polishing device according claim 1, wherein control limiting values are set to control of the periphery, and the control unit controls the periphery within a range of the control limiting values.

10. The polishing device according claim 1, wherein the pressing unit is formed from a circular pressure chamber and a plurality of annular pressure chambers therearound.

11. A polishing method for polishing a surface to be polished of an object to be polished by relatively sliding the surface to be polished and a polishing member, comprising:

a pressing process of pressing the surface to be polished against the polishing member by pressing a back side of the surface to be polished of the object to be polished by a pressing unit;

a thickness measuring process of estimating a remaining film profile of the surface to be polished of the object to be polished during polishing of the object to be polished; and a control process of controlling a pressing force on the back side of the surface to be polished by the pressing unit in accordance with a measurement result in the thickness measuring process during the polishing of the object to be polished, wherein the control process controls not only the pressing force on the back side of the surface to be polished by the pressing unit, but also a periphery of the pressing unit affecting a pressing force of the surface to be polished on the polishing member during the polishing, and a pressing force of the periphery is calculated during the polishing using a relationship of the pressing unit and the periphery with a polishing rate of the surface to be polished whose back side is directly pressed by the pressing unit.

12. The polishing method according to claim 11, wherein the pressing force on the back side of the surface to be polished and the pressing force of the periphery are determined simultaneously by closed loop control.

13. The polishing device according to claim 1, wherein the thickness measuring unit is an optical thickness sensor.

14. The polishing device according to claim 1, wherein the thickness measuring unit is an eddy-current type thickness sensor.

15. The polishing method according to claim 11, further comprising: repeating the thickness measuring process and the control process in a fixed period until the estimated remaining film profile becomes a target thickness profile.

16. The polishing method according to claim 11, wherein the periphery is a retainer member that presses the polishing member near the pressing unit, and the control process controls not only the pressing force on the back side of the surface to be polished by the pressing unit, but also a pressing force on the polishing member by the retainer member.

17. The polishing method according to claim 11, wherein the pressing process partially presses the back side of the surface to be polished of the object to be polished by a plurality of the pressing unit, and the periphery is the other neighboring pressing unit.

18. The polishing method according to claim 16, wherein the control process controls a pressing force of the periphery such that a thickness profile of the surface to be polished becomes uniform or a desired shape over an entire surface of the surface to be polished.

* * * * *